United States Patent [19]

Uhling

[11] Patent Number: 5,384,532
[45] Date of Patent: Jan. 24, 1995

[54] BIPOLAR TEST PROBE

[75] Inventor: Thomas F. Uhling, Monument, Colo.

[73] Assignee: Hewlett-Packard Company, Palo Alto, Calif.

[21] Appl. No.: 907,268

[22] Filed: Jul. 1, 1992

[51] Int. Cl.⁶ .................................... G01R 31/02
[52] U.S. Cl. .................... 324/754; 324/72.5
[58] Field of Search ........... 324/158 P, 158 F, 72.5, 324/121 R, 123, 754; 330/296, 286

[56] References Cited

U.S. PATENT DOCUMENTS

| | | | |
|---|---|---|---|
| 3,440,538 | 4/1969 | Riley | 324/123 R |
| 3,906,344 | 9/1975 | Addis et al. | 324/121 R |
| 4,236,120 | 11/1980 | White | 330/296 |
| 4,646,002 | 2/1987 | Tuszyski | 324/72.5 |
| 4,646,005 | 2/1987 | Ryan | 324/72.5 |
| 4,743,839 | 5/1988 | Rush | 324/72.5 |
| 4,803,423 | 2/1989 | Boutigny | 324/72.5 |
| 5,049,836 | 9/1991 | Christie et al. | 330/286 |

OTHER PUBLICATIONS

Ghausi; "Electronic Devices and Circuits: Discrete and Integrated;" 1985; pp. 209-210.
Hewlett Packard 500 MHz Probe Model No. 1120A, Operating Note, Apr., 1976, pp. 1-17.
Hewlett Packard 500 MHz Probe Model No. 1121A, Operating Note, Jun., 1977.
Tektronix P6201 Probe Instruction Manual, 1972, pp. i, ii, 1-1, 1-2, 3-1, 6-7, 6-8, 6-9.
Tektronix P6202A Probe Instruction Manual, Aug., 1982, pp. 1-1 to 1-7, 2-14, 3-1 to 3-4, 9-1, 9-3, 9-4.
Tektronix P6203 Bipolar Probe 10X, ID Instruction Manual (Preliminary Copy) Jan., 1988, pp. 1-1 to 1-6, 5-1, 5-2, 7-1 to 7-6.
Tektronix P6204 FET Probe 10M OHM, 10X, ID Instruction Manual, Nov., 1988, pp. 1-1 to 1-6, 5-1, 5-2, 7-1 to 7-6.

*Primary Examiner*—Vinh Nguyen

[57] ABSTRACT

An AC impedance buffer comprising a series of three bipolar transistors in emitter follower configuration is AC coupled to a probe input. An output bipolar transistor has its emitter connected to the output emitter of the AC buffer and its collector provides the probe output. A DC impedance buffer comprises an op amp having inputs connected to the probe input and output and output connected to the base of the output transistor. Another op amp negatively biases the emitter followers so their collectors can be grounded and adds the DC and low frequencies to the AC buffer.

18 Claims, 5 Drawing Sheets

BIPOLAR TEST PROBE

BACKGROUND OF THE INVENTION

1. Field of the Invention

The invention in general relates to electronic test equipment and more particularly to a test probe for connecting a circuit element to be tested with an oscilloscope or other electronic measurement device.

2. Statement of the Problem

Electronic circuits may be tested by measuring the voltage or other electrical parameter at various circuit nodes. To make such a measurement, the node to be tested must be electrically connected to a test instrument, such as an oscilloscope. The connection is generally made via a test probe. A test probe is essentially an impedance buffer, that is, a circuit with an output having a significantly different impedance than the impedance of its input. Generally, the voltage or other electrical parameter on the output of the test probe follows the voltage or other electrical parameter applied to its input. In addition, the nominal voltage at the input, that is, the voltage when the probe is not being applied to a circuit to be tested, is generally a zero voltage so that the probe does not apply any voltage to the circuit node to which it is applied. Further, the impedance at the input is as high as possible to prevent the test probe and test instrument to which it is connected from drawing significant current or otherwise significantly altering the electrical parameters on the node to be tested. The impedance of the output is generally a standard value, such as 50 ohms, to which the test instrument is designed to couple. Early test probes comprised simple conductors, such as a wire, and a few passive components, such as resistors, to provide an impedance buffer. Such passive test probes are adequate for connecting test equipment to circuits with DC or relatively low frequency electrical cycles. Present-day high frequency circuits require active probes, that is probes with active circuit elements, such as transistors, driven by a probe power source.

To obtain a high input impedance and low loading of the circuit to be tested, prior art active test probes have generally utilized JFET or MOSFET transistors, which characteristically have a high input impedance. However, such transistors typically also have a high input capacitance and low band width (BW). As the speed of digital circuits has increased, this high input capacitance and low BW characteristic of FETs have created problems. The high input capacitance results in increased loading as the speed of the circuit to be tested increases, and the low BW results in inaccuracies in measurement due to the misrepresentation of rise time and timing in general within fast logic circuits. Thus, some prior art test probe designs have used bipolar transistors to achieve lower input capacitance and higher BW. However, since bipolar transistors typically have low input impedances, prior art test probe designs utilizing bipolar transistors have been unable to achieve input impedances greater than 10 kohms. Thus such probes are not able to effectively test certain families of TTL and CMOS logic that require probes with higher input impedances. Further, the bipolar transistors generally have their collectors connected to VCC, since the collectors must be at a voltage higher than the base and the base must be at a voltage higher than the emitter for the transistor to operate properly. The collectors also tend to have high frequency current spikes typically produced during transistor switching. Such current spikes passing through the VCC common line, to which the collectors are connected, often cause voltage spikes due to the distributed inductance on the VCC common line, which voltage spikes can cause serious circuit malfunctions unless filtering is used. The conventional manner of filtering such spikes has been the use of power supply bypass capacitors between VCC and ground. The length of bypass capacitors look inductive at high frequencies. This inductance, when combined with the output capacitance of the circuit being bypassed, forms a resonant circuit which results in stability problems if the resonant frequency is within the band width of the probe amplifier. As a result, the BW of prior art bipolar test probe circuits have been limited to 1 gigahertz or less and therefore have not been able to be used to test the increasingly fast circuits available today, such as fast ECL logic circuits. In addition, the bipolar circuits generally have nonlinearities in their outputs due to, for example, thermal changes that produce thermal tails. To reduce these nonlinearities, prior art bipolar test probe circuits have used complementary pairs of bipolar transistors; that is, for each npn transistor there is a corresponding circuit with a pnp transistor. This means that twice as many transistors are required for any such bipolar circuits. In instruments where a significant amount of space is available for the circuit, such as preamplifiers for oscilloscopes, some designs have used op amps to remove nonlinearities, though not in combination with bipolar high frequency circuits. However, test probes must generally be designed so that they can effectively be applied by hand to tiny circuit nodes. Thus there is a need for a test probe that has low input capacitance and a wide band width capable of testing today's fast circuits, provides an input resistance greater than 10 kohms, and at the same time is sufficiently compact that it can fit in a hand-sized probe body.

3. Solution to the problem:

The present invention solves the above problems by providing a test probe that utilizes a bipolar input stage comprising a series of three or more bipolar emitter followers, which results in an input resistance of 100 kohms and a input capacitance of only 0.6 picofarads.

The invention also provides a unique design for biasing the bipolar input stage so that destabilizing bypass capacitors are not required. The input of the test probe is AC coupled to the bipolar emitter followers. This allows the transistor bases of the emitter followers to be biased to a negative voltage when the input of the probe is at the nominal zero volts. The negative biasing of the emitter follower transistor bases allows the collectors of the emitter followers to be at ground potential. Since the collectors are at ground, there is no need for capacitors to bypass to ground.

The AC coupling of the emitter follower stage means that DC and low frequency signals will not be passed to that stage. The invention also provides a DC and low frequency impedance buffer path. Preferably this DC and low frequency impedance buffer path is a provided by an op amp that forces the output of the probe to follow the input at DC and low frequencies. The invention thus provides a dual path amplifier, one path amplifying high frequency signals and the other path amplifying DC and low frequency signals.

Preferably, the voltage for biasing the emitter followers is provided by a second op amp.

The invention also provides a circuit to shift the output voltages of the emitter follower stage back to the probe input nominal zero voltage bias level. Preferably, this circuit is a common base bipolar transistor.

Preferably, the output of the DC and low frequency impedance buffer is fed back into the high frequency impedance buffer output through the base of the common base bipolar amplifier.

Preferably the second op amp, i.e the op amp that adjusts the bias of the bipolar stage, is connected to the output of the probe, which contains the DC and low frequencies via the first op amp, and thus also adjusts the bias of AC bipolar stage to follow the DC and low frequencies, thereby preventing DC inaccuracies in the input stage.

The invention also provides protection against being over driven and further protection against current spikes by utilizing a constant current power source to bias the high frequency amplifier.

The invention provides a test probe that not only has high input impedance and low input capacitance, but also has a BW of about 2.5 gigahertz.

SUMMARY OF THE INVENTION

The invention provides an electronic test probe comprising: a probe input and a probe output; and an AC impedance buffer electrically connected between said probe input and said probe output, said AC impedance buffer comprising a series of three or more emitter followers, each emitter follower including at least one bipolar transistor. Preferably the probe further comprises: AC coupling means for AC coupling and DC isolating said AC impedance buffer from said probe input; and biasing means for negatively biasing said bipolar transistors. Preferably, the collectors of said transistors are grounded. Preferably, the probe further comprises a constant current power source powering said transistors.

In another aspect, the invention provides an electronic test probe comprising: a probe input and a probe output; an AC impedance buffer AC coupled to said probe input and electrically connected to said probe output, said AC impedance buffer including an AC buffer input node; and a DC impedance buffer DC coupled to said probe input and electrically connected to said probe output; DC signal follower means for causing said AC buffer input node to follow the DC and low frequency signals on said probe input. Preferably, said DC signal follower means comprises an op amp. Preferably, said AC impedance buffer includes an AC impedance buffer output node, said op amp incudes two inputs and an and output, one of said op amp inputs is connected to said probe output, the other of said op am inputs is connected to said AC impedance buffer output node, and said op amp output is connected to said AC input node.

In a further aspect the invention provides an electronic test probe comprising: a probe input and a probe output; a bipolar impedance buffer coupled to said probe input and electrically connected to said probe output, said bipolar impedance buffer including one or more bipolar transistors; and an op amp impedance buffer coupled to said probe input and electrically connected to said probe output, said op amp impedance buffer including op amp means for eliminating nonlinearities in the output of said bipolar transistors. Preferably, said op amp means comprises a first op amp having two first op amp inputs, one of said first op amp inputs connected to said probe input and the other of said first op amp inputs connected to said probe output. Preferably, said bipolar impedance buffer includes a bipolar impedance buffer input node and a bipolar impedance buffer output node, said op amp means further includes a second op amp having two second op amp inputs and a second op amp output, one of said second op amp inputs is connected to said probe output, the other of said op am inputs is connected to said bipolar impedance buffer output node, and said second op amp output is connected to said bipolar impedance buffer input node.

In yet another aspect the invention provides an electronic test probe comprising: a probe body means for being held in the human hand to probe electronic circuits; an electronic circuit enclosed in said probe body means, said electronic circuit comprising: a probe input and a probe output; AC impedance buffer means AC coupled to and DC isolated from said probe input for providing an AC path between said probe input and said probe output; and DC impedance buffer means DC coupled to said probe input for providing a DC path between said probe input and said probe output. Preferably, said electronic circuit further comprises a constant current power source for powering said AC impedance buffer means.

In yet a further aspect, the invention provides an electronic test probe comprising: a probe input and a probe output; a bipolar impedance buffer electrically connected between said probe input and said probe output, said bipolar impedance buffer comprising a bipolar transistor; AC coupling means for AC coupling and DC isolating said bipolar impedance buffer from said probe input; and biasing means for negatively biasing said bipolar transistor. Preferably, said bipolar transistor is configured as an emitter follower, the base of said bipolar transistor is negatively biased, and the collector of said bipolar transistor is grounded. Preferably, said biasing means comprises an op amp.

The invention not only provides an electronic test probe with high impedance, low capacitance, and a large BW, but also does so relatively compactly. The elimination of the bypass capacitors saves considerably more space than is used up by the dual amplification circuit. Thus the net result is a test probe that is as compact as prior art test probes that utilized a single amplification path. Numerous other features, objects and advantages of the invention will become apparent from the following description when read in conjunction with the accompanying drawings.

DESCRIPTION OF THE PREFERRED EMBODIMENT

1. Overview

Figure 1:
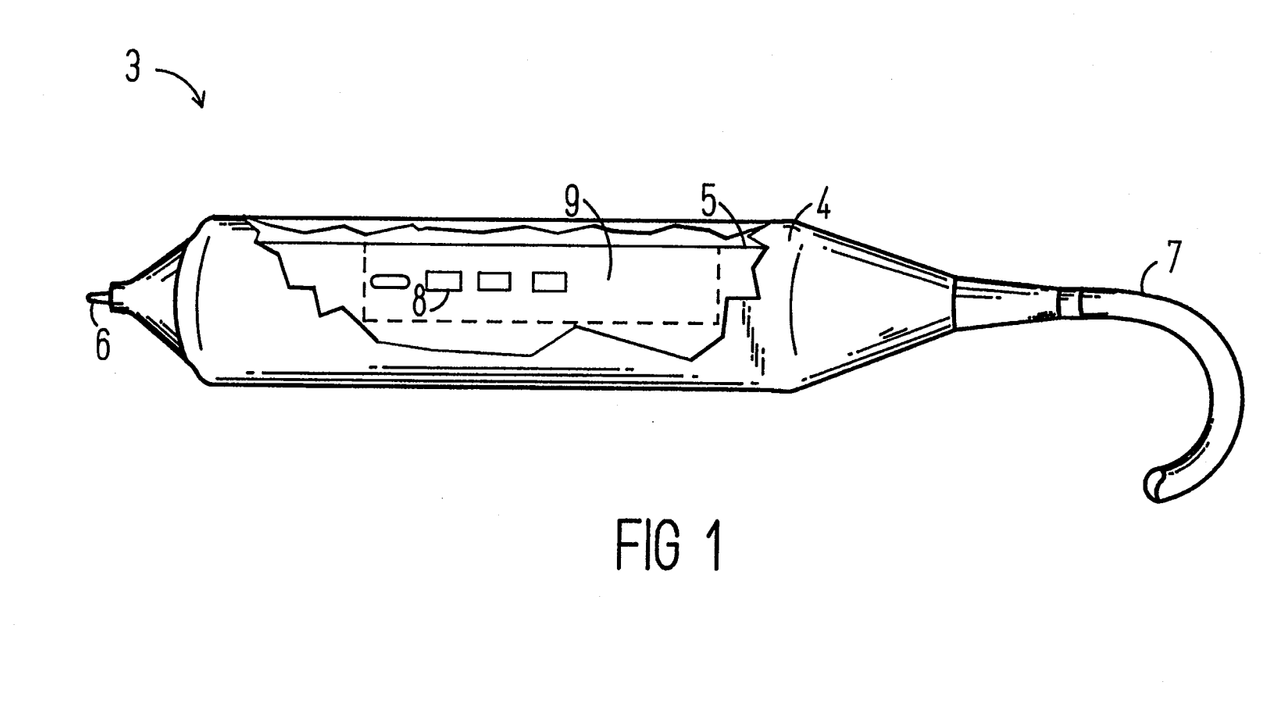
FIG. 1 is a sketch of an electronic test probe with the probe body partially cut away to expose the probe circuit.
Figure 2:
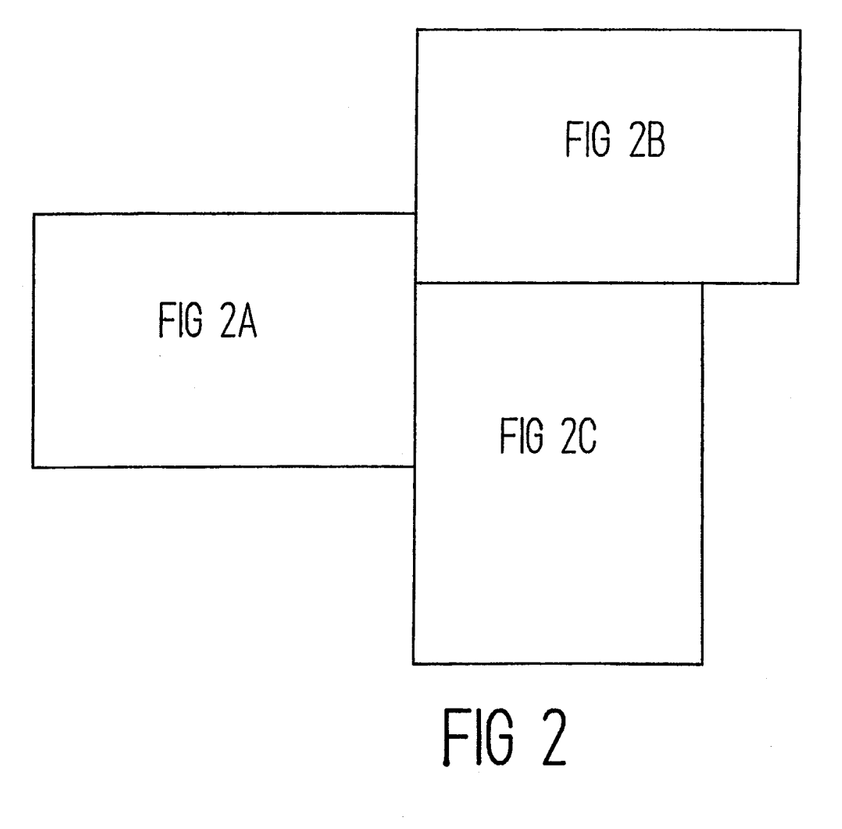
FIG. 2 is a figure map showing the arrangement of FIGS. 2A through 2C.

FIG. 1 shows an electronic test probe 3 with the probe body 4 partially cut away. The probe 3 comprises a probe body 4 which is designed to fit comfortably in a human hand, a probe circuit board 5 which holds the probe circuit 10 (FIGS. 2 through 2C) including circuit elements such as 8, a probe contact 6 for contacting the circuit element to be tested, and a cable 7 which connects through a probe interface (not shown) to an oscilloscope or other test instrument (not shown). FIG. 2 is a map showing how the FIGS. 2A, 2B and 2C should be arranged to show the full circuit diagram of the preferred embodiment of the test probe circuit 10 according to the invention. The electrical lines a, b, c, and d, on the right in FIG. 2A correspond to the lines a and b in FIG. 2B and the lines c and d in FIG. 2C. The electrical lines e, f, and g at the bottom of FIG. 2B correspond to the lines e, f, and g at the top of FIG. 2C. It should be understood that the particular embodiment of the invention described herein is exemplary, and is described in detail to more clearly and fully depict the invention than would otherwise be possible; it is not meant to limit the invention to this particular embodiment. The test probe circuit 10 includes an input 18 (FIG. 2A) which is electrically connected to contact 6 (FIG. 1), a probe output 30, and various power source lines 51, 21, and 23 (FIG. 2B) which connect via cable 7 (FIG. 1) to a probe interface (not shown) which is either a separate electronic module or part of an oscilloscope or other test instrument. Circuit 10 also comprises AC impedance buffer 12, shown in FIG. 2A, the principal components of which include three bipolar transistors 14A, 14B, and 14C arranged in emitter follower amplifier configuration, capacitor 16 which isolates the AC buffer input node 17 from the probe input 18, and op amp 20, which is a biasing means which forces node 17 to a negative bias voltage allowing the collectors 15A, 15B, and 15C of the transistors 14A, 14B, and 14C respectively to be grounded, that is connected either directly or through a resistor to the circuit ground 9. Physically, ground 9 is a relatively large ground trace 9, indicated by the dotted line in FIG. 1, on the reverse side of the circuit board from the components, such as 8. Further, the negative power to the op amps 20 and 22 is provided via a constant current voltage source −VEE. This limits the current that the circuit 10 can draw. The AC impedance buffer 12 provides the high frequency amplification path of the probe circuit 10 which outputs the high frequency signal to FIG. 2B on line a. The DC and low frequency path passes along line d to FIG. 2C, to a DC and low frequency impedance buffer 11 comprising op amp 22, the output of which connects to output circuit 24 in FIG. 2B via line e. Output circuit 24 comprises common base bipolar transistor 26 which shifts the level of the high frequency output signal on line a back up to a nominal zero volts, adds in the DC and low frequency components coming from op amp 22 on line e, and provides an impedance buffer between the op amp 22 and the probe output 30. Bipolar transistor 28 provides an additional emitter follower impedance buffer between op amp 22 and probe output 30.

2. Detailed Description of the Probe Circuit

Figure 2A:
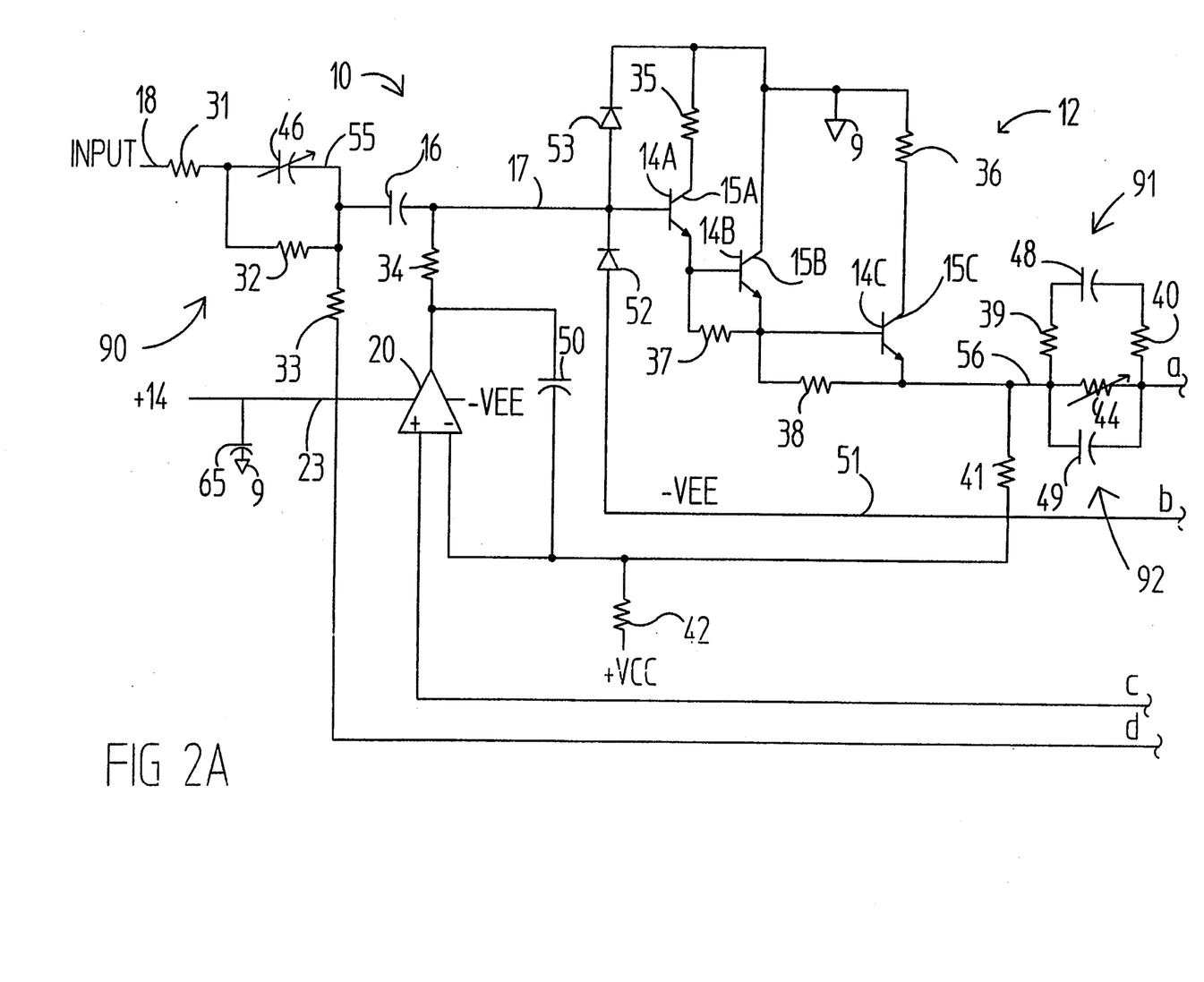
FIGS. 2A through 2C are a detailed circuit diagram of the preferred embodiment of the test probe circuit according to the invention.

Turning to FIG. 2A the test probe circuit 10 comprises transistors 14A, 14B, and 14C, capacitor 16, op amp 20, resistors 31 through 42, variable resistor 44, variable capacitor 46, capacitors 48 through 50, and diodes 52 and 53. The probe input 18 is electrically connected to the test probe contact 6 (FIG. 1) and to one side of variable capacitor 46 through resistor 31 and to the node 55, connecting the other side of variable capacitor 46 and one side of AC coupling capacitor 16, through resistor 32. The node 55 is also connected to the negative input of op amp 22 (FIG. 2C) through resistor 33. The other side of capacitor 16 is connected to the AC buffer input node 17 which is connected to the gate of transistor 14A, the anode of diode 53, the cathode of diode 52, and the output of op amp 20 through resistor 34. The output of op amp 20 is also connected to its negative input through capacitor 50. The negative input of op amp 20 is also connected to +VCC thorough resistor 42 and to the AC buffer output node 56 through resistor 41. The anode of diode 52 is connected to the −VEE constant current voltage source 51. The collector 15A of transistor 14A is connected through resistor 35 to both the cathode of diode 53 and to ground 9. The emitter of transistor 14A is connected to the base of transistor 14B which is connected to its own emitter through resistor 37. The emitter of transistor 14B is also connected to the base of transistor 14C, which is connected to its own emitter through resistor 38. The collector 15B of transistor 14B is connected to ground 9, while the collector 15C of transistor 14C is connected to ground 9 through resistor 36. The emitter of transistor 14C is also connected to AC buffer output node 56. Node 56 is connected via line a to the emitter of transistor 26 (FIG. 2B) through variable resistor 44 and also through capacitor 49. Node 56 is also connected to line a through resistor 39, capacitor 48, and resistor 40 connected in series.

Figure 2B:
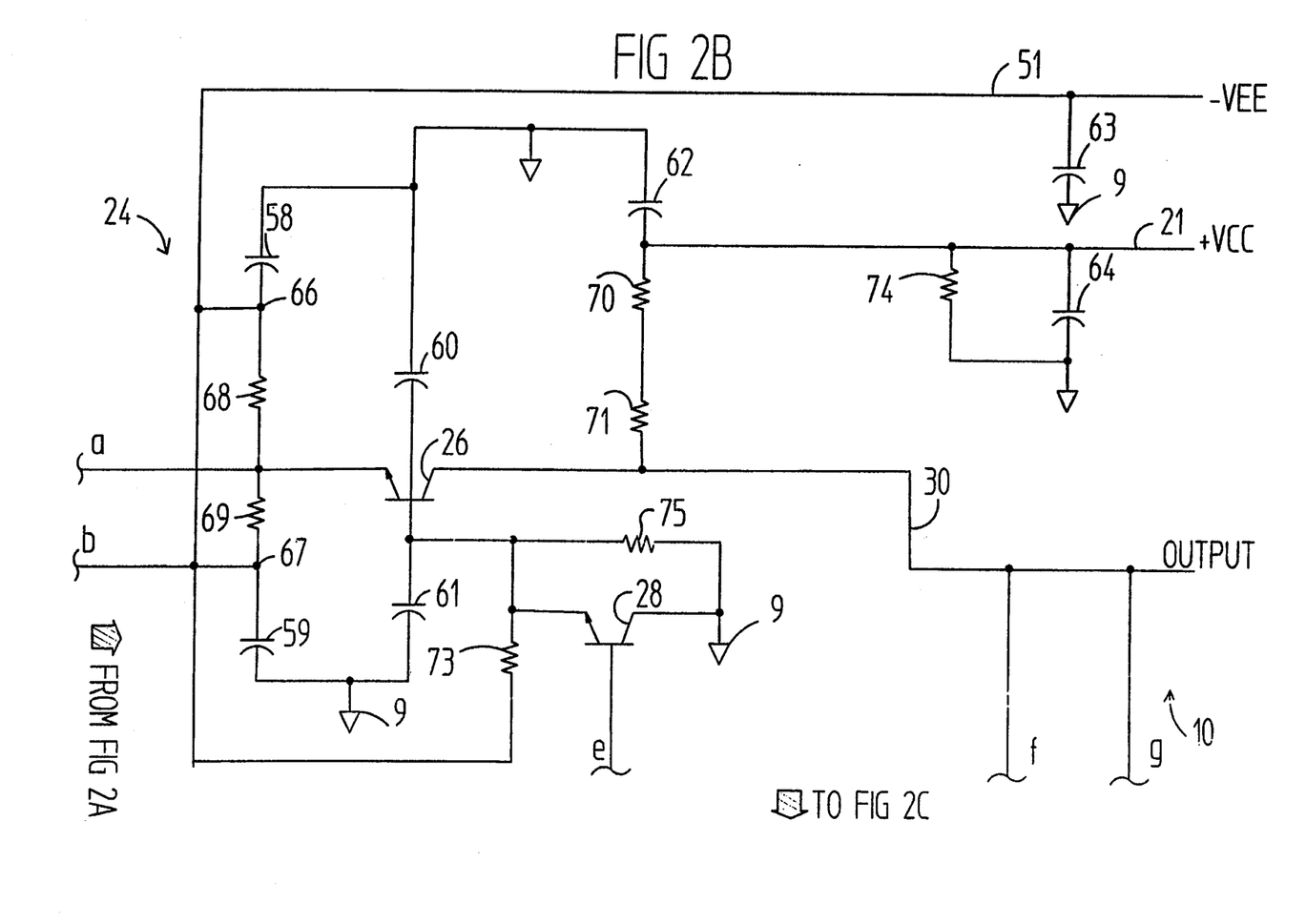
Figure 2C:
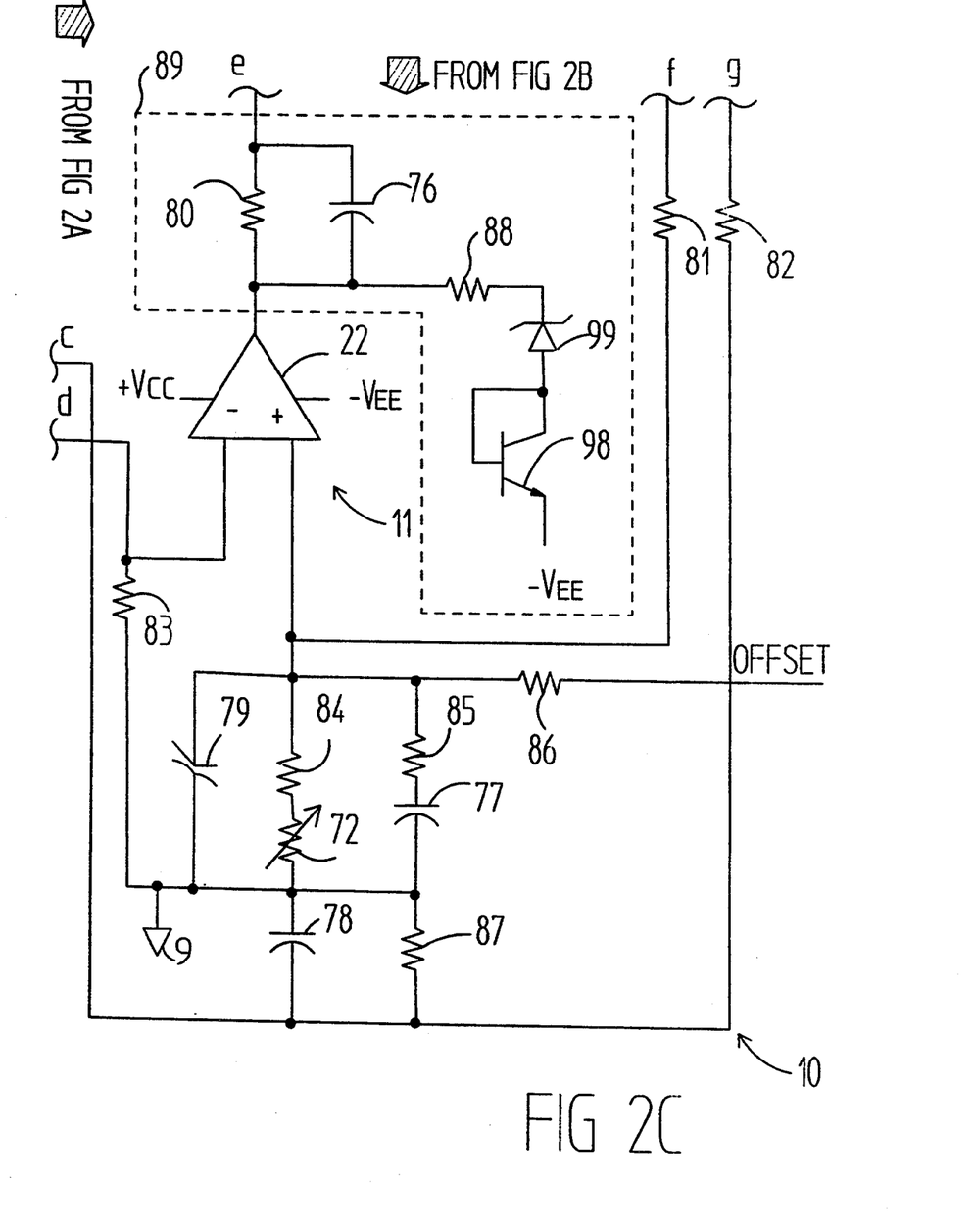

Turning to FIG. 2B, the probe circuit 10 also 80 through 88. The probe output line 30 in FIG. 2B is connected via line f to the positive input of op amp 22 in FIG. 2C through resistor 81. Output line 30 is also connected via lines g and c to the positive input of op amp 20 in FIG. 2A through resistor 82 (FIG. 2C). The positive input of op amp 22 is also connected to the OFFSET line through resistor 86, to one side of variable resistor 72 through resistor 84, and the other side of variable resistor 72 through resistor 85 and capacitor 77 connected in series. The other side of variable resistor 72 is also connected to line c through capacitor 78 and resistor 87 connected in parallel and to ground. The positive input of op amp 22 is also connected to ground through capacitor 79. As indicated above, the negative input to op amp 22 is connected to the input node 55 in FIG. 2A through resistor 33 via line d, and also to ground through resistor 83. The output of op amp 22 is connected via line e to the base of transistor 28 in FIG. 2B through resistor 80 and capacitor 76 connected in parallel, as indicated above, and also the cathode of diode 99 through resistor 88. The anode of diode 99 is connected to the collector of transistor 98, which is in turn connected to its own base. The emitter of transistor 98 is connected to the −VEE constant current power source 51.

In the preferred embodiment, transistors 14A and 14B are AT-60200 NPN transistors, transistors 14C and 26 are AT-42000 NPN transistors, transistors 28 and 98 are 3904 transistors, op amp 22 is an AD OP-27 op amp having a GBW of greater than 5 MHz and an offset of less than 100 $\mu$V, op amp 20 is an AD 548 op amp having a GBW of greater than 0.8 MHz and an offset of less than 2 mv, diodes 52 and 53 are 5082-0001 pin diodes, diode 99 is a 5.1 volt Zener diode, variable resistor includes transistors 26 and 28, capacitors 58 through 65, and resistors 68 through 74. As indicated above, the emitter of transistor 26 is connected to the emitter of transistor 14C in FIG. 2A through variable resistor 44. The emitter of transistor 26 is also connected to the −VEE constant current voltage source 51 through resistors 68 and 69 in parallel. The node 66 connecting resistor 68 with the −VEE source 51 is connected to ground through capacitor 58, while the node 67 connecting resistor 69 to the −VEE source 51 is connected to ground through capacitor 59. The collector of transistor 26 is connected to output line 30, while its base is connected to the emitter of transistor 28, which is in turn connected to the −VEE constant current power source 51 through resistor 73. The base of transistor 26 is also connected to ground through capacitors 60 and 61 in parallel. The emitter of transistor 28 is also connected to its own collector through resistor 75, which is in turn connected to ground. The base of transistor 28 is connected to the output of op amp 22 in FIG. 2C through resistor 80 and capacitor 76 connected in parallel. The −VEE constant current voltage source 51 is connected to ground through filter capacitor 63. The +VCC voltage source is connected to ground through capacitor 64 and resistor 74 in parallel, and is also connected to ground through capacitor 62, and to the probe output 30 through resistors 70 and 71 in series. There is also a +14 volt power source which is applied solely to op amp 20 in FIG. 2A. The +14 volt power source is connected to ground through filter capacitor 65.

Turning now to FIG. 2C, the circuit 10 also includes op amp 22, transistor 98, diode 99, variable resistor 72, capacitors 76 through 79, and resistors 44 has a nominal target value of 28.8 ohms and is active trimmed to set the RF gain of the probe to match the DC gain, preferably within a half percent, variable resistor 72 has a nominal target value of 396.7 ohms minus the resistance of resistor 84, or 25.2 ohms, and is active trimmed to set the DC accuracy of the probe to +/−0.5%, variable capacitor 46 is active trimmed to set the input compensation of the probe to match the RF gain to within 0.5%, capacitors 16, 48, 49, 50, 58, 59, 60, 61, 62, 63, 64, 65, 76, 77, 78 and 79 have capacitances of 200 pf, 1.8 pf, 1.5 pf, 3.3 nf, 10 nf, 10 nf, 680 pf, 680 pf, 47 nf, 1 µf, 22 µf, 1.5 µf, 10 nf, 6.8 nf, 3.3 nf, and 3.3 pf respectively, and resistors 31, 32, 33, 34, 35, 36, 37, 38, 39, 40, 41, 42, 68, 69, 70, 71, 72, 73, 74, 80, 81, 82, 83, 84, 85, 86, 87, and 88 have resistances of 183 ohms, 89.8 kohms, 9.6 kohms, 600 kohms, 100 ohms, 60 ohms, 450 ohms, 170 ohms, 220 ohms, 145 ohms, 600 kohms, 400 kohms, 80 ohms, 80 ohms, 10 ohms, 90 ohms, 3 kohms, 1 kohm, 100 ohms, 3 kohms, 9.6 kohms, 600 kohms, 400 ohms, 371.5 ohms, 14 kohms, 16.7 kohms, 400 kohms, and 250 ohms respectively.

The invention functions as follows. Capacitor 16 provides AC coupling and DC isolation between the input 18 and the high frequency AC impedance buffer 12. The three bipolar transistors 14A, 14B, and 14C in emitter follower configuration provide an input impedance buffer and the high frequency amplification path. The output of the three emitter followers is fed to output transistor 26 (FIG. 2B) via AC buffer output node 56. DC impedance buffer 11 (FIG. 2C) provides the DC and low frequency amplification path. The low frequency signals pass from input 18 to the negative input of op amp 22 via line d. The positive input of op amp 22 is connected to the probe output 30. In this manner op amp 22 provides a DC and low frequency signal to output transistor 26 which ensures that probe output 30 follows the signal on input 18. Transistor 26 is configured as a common base amplifier. In this configuration, output transistor 26 adds together the high frequency output from input stage 12 and the DC and low frequency output from op amp 22 to provide the output signal on probe output 30. Output transistor 26 also shifts the negative voltage bias of the AC impedance buffer 12 back up to a nominally zero voltage and provides a gain of about 1.1. Finally, output circuit 24 also provides an output impedance buffer for op amp 22. That is, op amp 22 has an output impedance of zero ohms. However, the probe specification calls for an output impedance of 100 ohms to optimize tradeoffs between power consumption and dynamic range. This 100 ohm impedance is provided primarily by resistors 70 and 71. Transistor 28 provides additional buffering between op amp 22 and transistor 26 so that the high frequency performance of transistor 26 is not affected by op amp 22.

In prior art designs an impedance buffer such as the three bipolar emitter followers 14A, 14B, and 14C would require bypass capacitors from their collectors to ground, which would result in instability at high frequencies. However op amp 20 biases the AC buffer input node 17 to a negative voltage as compared to input node 55, which negative voltage is preferably minus 3.6 V when node 55 is at zero volts. Since node 17 is negative, collectors 15A, 15B, and 15C may be connected to ground and the emitter followers 14A, 14B, and 14C will function properly since their collectors are at a higher voltage than their bases. Since the collectors are grounded, no bypass to ground is required. Resistors 37 and 38 provide a self-biasing network to minimize parasitic loading and optimize the input resistance. The positive input of op amp 20 is connected to the output 30 (FIG. 2B) and the negative input is connected to the AC buffer output node 56. As a result, op amp 20 also adjusts the bias on AC buffer input node 17 so that the AC buffer output node 56 follows the probe output 30, though at a different bias level, at DC and low frequencies. Since probe output 30 follows input 18 at DC and low frequencies due to the action of op amp 22, op amp 20 thus causes the AC buffer output node 56 to follow input 18 at DC and low frequencies. Thus the two op amps 20 and 22 together comprise a DC signal follower means (represented by feedback lines 80, c, and f in FIG. 2) for causing the AC buffer input node 17 to follow the DC and low frequency signals on the probe input 18. Since at high frequencies node 56 is coupled to input 18 through capacitor 16 and node 17, the node 56 follows the input 18 at all frequencies. Adding in the DC and low frequencies through op amp 20 prevents shifts in output signal level due to, for example, large AC spikes on top of a large DC change. Resistors 34, 41, and 42 and capacitor 50 adjust the bias and gain of op amp 20 to maintain the appropriate negative bias on nodes 17 and 56. Resistors 34 and 41 are both very high resistance values, the first to yield the high input impedance, and the second to provide the appropriate large voltage drop needed to bias node 56 to a negative voltage. A +14 volt power source is used to power op amp 20 because of the high impedance of resistor 34.

Returning to FIG. 2A, the RC circuits 90, 91, and 92 are "cable connection networks" that is they provide gain to compensate for the loss in gain due to the cable connecting the probe to the test instrument. This loss is a function of frequency, so several different networks are provided to offset the loss within different frequency ranges. The network 90 comprising variable capacitor 46 and resistor 32 provides a gain boost in a range about the 10 megahertz frequency, the network 91 comprising resistors 39 and 40, variable resistor 44, and capacitor 48 provides a gain boost in a range about the 100 megahertz frequency, and the network 92 comprising capacitor 49 and variable resistor 44 provide a gain boost in a range about the 1.5 gigahertz frequency. Capacitor 79 (FIG. 2C) provides a gain boost to compensate for cable loss in a range about the 1 megahertz frequency.

The −VEE constant current source 51 voltage is nominally −10 volts. The constant current source 51 protects the trace electronics from being over driven, for example from too large a voltage at input 18. Too much current in the probe circuits can melt the fine gold traces. The prior art generally used voltage clamping circuits to provide such protection. The constant current source 51 provides the protection without such bulky clamping circuits. Since the power to op amps 20 and 22 is limited by the constant current source, and through the op amps, the power to the other parts of the circuit, such as the impedance buffer circuit 12 is also limited, the constant current power source −VEE limits the current drawn by the circuit 10 as a whole. Diodes 52 and 53 provide further over-voltage protection. Normally both diodes are off. If the voltage on node 17 becomes higher than about +0.7 volts, diode 53 will turn on and if the voltage on node 17 becomes less than about −11 volts, diode 52 will turn on, thus keeping the base of transistor 14A within a prescribed voltage range.

Turning to FIG. 2B, the capacitors 58 through 65 are bypass capacitors. Resistors 68, 69, 70, 71, and 72 adjust the bias of the nodes to which they connect, and resistors 70 and 71 also set the gain of transistor 26. Resistor 70 is a temperature compensated resistor which adjusts the gain of the bipolar amplifiers, i.e circuits 12 and 24, for temperature shifts.

Turning to FIG. 2C, the circuit 89 comprised of resistors 80 and 88, capacitor 76, Zener diode 99, and transistor 98 is a protective circuit which prevents the output of op amp 22 from over driving transistors 26 and 28. Resistors 81 and 82 and resistor 33 in FIG. 2A control the gain on the inputs of the op amps to which they connect. Resistor 85 and capacitor 77 provide a gain correction factor for op amp 22 that corrects for gain shifts with frequency in the circuit composed of resistor 83 and capacitor 16 and resistors 32, 33 and 34 in FIG. 2A. That is, as the frequency goes up, capacitor 16 begins to look like a short between the resistors 32 and 33 and resistor 34. This places the resistors 83 and 33 in parallel with the resistance of resistor 34 and the input resistance of amplifier 12 and thus lowers the gain of the low frequency amplifier loop. The circuit composed of resistor 85 and capacitor 77 increases the gain of the low frequency amplifier loop within its frequency range of up to 500 KHz to compensate. Resistors 81, 83, 84, 72, and 33 (FIG. 2A) set the gain of op amp 22. Resistors 82, 87, and 41 (FIG. 2A) set the gain of op amp 21. Capacitors 78 and 50 (FIG. 2A) control the frequency response of op amp 20; that is, these capacitors cause op amp to roll off at high frequencies so that it does not affect the high frequency response of node 17.

The op amps 20 and 22 provide an additional function that enables the three emitter follower bipolar high frequency circuit to be successfully used in the probe. Bipolar transistors heat up and their physical parameters change when a pulse passed through them. Then as they gradually cool, they change back to their original parameters. This cooling creates a nonlinear, low frequency thermal tail on their output. The op amps 20 and 22 take this low temperature tail out of the response. Further, the op amps are very stable with temperature, thus do not add any other extraneous instability into the low frequency response.

It is a feature of the invention that three bipolar emitter followers provide the high frequency input buffer. This provides an impedance 10 times higher than prior art bipolar probes that enables the probe to be used for testing a wide variety of circuits.

A further feature of the invention is that the bases of the emitter followers are negatively biased, which allows their collectors to be connected directly to ground. This permits the elimination of bypass capacitors, resulting in high frequency stability and a band width to 2.5 gigahertz. Bypass capacitors are also very bulky, thus this feature also leads to the compactness feature discussed below.

Another feature of the invention is that it provides a dual path from input to output, one for high frequencies and another for DC and low frequencies.

Another feature of the invention is that it employs a constant current power source in the probe body. This enables bulky voltage clamping circuits to be eliminated.

Yet another feature of the invention is the simplicity and compactness of the circuit. The entire circuit described above fits in the probe body, as compared to prior art circuits that required separate assemblies that were mounted between the probe and the test instrument.

A further feature of the invention is the stability of the probe even when subjected to large, fast pulses and temperature changes. The instabilities of the bipolar probes are overcome by features discussed above plus op amps that eliminate any low frequency instabilities.

There has been described a novel test probe which provides high input impedance, large band width, and low input capacitance and which has many other advantages. It should be understood that the particular embodiment shown in the drawings and described within this specification is for purposes of example and should not be construed to limit the invention which will be described in the claims below. Further, it is evident that those skilled in the art may now make numerous uses and modifications of the specific embodiment described, without departing from the inventive concepts. For example, now that it is seen to be advantageous to a negative input bias in combination with bipolar transistors in emitter follower configuration, other configurations of bipolar transistors may be used. Further, the invention clearly shows the advantages of combining low frequency op amp circuits with high frequency bipolar circuits. The invention may also be used in other types of impedance buffers than that described. Or equivalent components or circuits can be substituted for the various components and circuits described. Additional features may be added. A greater or lesser number of parts may be used. Consequently, the invention is to be construed as embracing each and every novel feature and novel combination of features present in and/or possessed by the test probe described.

What is claimed is:

1. An electronic test probe comprising:
   a probe input and a probe output; and
   an AC impedance buffer electrically connected between said probe input and said probe output, said AC impedance buffer comprising a series of three or more emitter follower configured bipolar transistors, each having a collector, a base, and an emitter, wherein the base of a first bipolar transistor forms an input to the AC impedance buffer, a base of a second bipolar transistor is coupled to an emitter of the first bipolar transistor, and the base of a third bipolar transistor is coupled to an emitter of the second bipolar transistor and the emitter of the third bipolar transistor forms an output of the AC impedance buffer;

AC coupling means for AC coupling and DC isolating said AC impedance buffer from said probe input; and biasing means for negatively biasing each of said bipolar transistors.

2. An electronic test probe as in claim 1 wherein each said bipolar transistor has a collector connected to ground.

3. An electronic test probe comprising:

a probe input and a probe output; and an AC impedance buffer electrically connected between said probe input and said probe output, said AC impedance buffer comprising a series of three or more emitter followers, each emitter follower including at least one bipolar transistor;

an AC impedance buffer input node coupled to said AC impedance buffer;

an AC coupling means for coupling AC signals from the probe input to said AC impedance buffer node and blocking DC and low frequency signals from passing from said probe input to said AC impedance buffer node; and a DC impedance buffer coupled to said probe input and forming a path from said probe input to said probe output for said DC and low frequency signals.

4. An electronic test probe as in claim 3 wherein said DC impedance buffer comprises a first op amp.

5. An electronic test probe as in claim 4 and further including a second op amp for negatively biasing said AC impedance buffer input node.

6. An electronic test probe as in claim 5 wherein said op amps cause said AC impedance buffer input node to follow said probe input at DC and low frequencies.

7. An electronic test probe comprising:

a probe input and a probe output;

an AC impedance buffer AC coupled to said probe input and electrically connected to said probe output, said AC impedance buffer including an AC buffer input node;

a DC impedance buffer coupled to said probe input and to said probe output wherein said DC impedance buffer is coupled in parallel with said AC impedance buffer; and DC signal follower means coupled to said probe input through said DC impedance buffer and coupled to said AC buffer input node for causing said AC buffer input node to follow the DC and low frequency signals on said probe input.

8. An electronic probe as in claim 7 wherein said DC signal follower means comprises an op amp.

9. An electronic probe as in claim 8 wherein said AC impedance buffer includes an AC impedance buffer output node, said op amp includes two inputs and an output, one of said op amp inputs is connected to said probe output, the other of said op am inputs is connected to said AC impedance buffer output node, and said op amp output is connected to said AC input node.

10. An electronic test probe comprising:

a probe input and a probe output;

an AC impedance buffer coupled to said probe input and to said probe output, said AC impedance buffer including one or more bipolar transistors, wherein a base of said one or more bipolar transistors provides an AC buffer input node and an emitter of said one or more bipolar transistors provides an AC buffer output node;

an op amp impedance buffer coupled to said probe input and electrically connected to said probe output.

11. An electronic probe as in claim 10 wherein said op amp impedance buffer comprises a first op amp having two first op amp inputs, one of said first op amp inputs being connected to said probe input and the other of said first op amp inputs being connected to said probe output.

12. An electronic probe as in claim 11 wherein said AC impedance buffer includes an AC impedance buffer input node and an AC impedance buffer output node, said electronic probe further includes an AC impedance buffer bias circuit comprising a second op amp having two second op amp inputs and a second op amp output, one of said second op amp inputs is connected to said probe output, the other of said second op amp inputs is connected to said AC impedance buffer output node, and said second op amp output is connected to said AC impedance buffer input node, wherein said first op amp and said second op amp cooperate to eliminate temperature induced nonlinearities caused by said one or more bipolar transistors.

13. An electronic test probe comprising:

a probe body means for being held in the human hand to probe electronic circuits;

an electronic circuit enclosed in said probe body means, said electronic circuit comprising:

a probe input for receiving an input signal having high frequency signal components and DC and low frequency signal components and a probe output for providing an output signal, wherein said output signal is substantially similar to said input signal;

an AC coupling means for coupling said high frequency signal component from the probe input to an input node and blocking said low frequency signal component from passing from the probe input to the input node;

AC impedance buffer means coupled to said input node for providing a signal path between said input node and said probe output for said high frequency signal component; and DC impedance buffer means DC coupled to said probe input for providing a signal path between said probe input and said probe output for said DC and low frequency signal component.

14. An electronic test probe as in claim 13 wherein said electronic circuit further comprises a constant current power source for powering said AC impedance buffer means.

15. An electronic circuit as in claim 14 wherein said AC impedance buffer means includes one or more bipolar transistors.

16. An electronic test probe comprising:

a probe input and a probe output;

an AC impedance buffer electrically connected between said probe input and said probe output, said AC impedance buffer comprising at least one bipolar transistor, wherein a base of said at least one bipolar transistor forms an input to said AC impedance buffer and a collector of said at least one bipolar transistor is coupled to ground;

AC coupling means for coupling a high frequency signal on said probe input to said AC impedance buffer and isolating said AC impedance buffer from low frequency and DC signals on said probe input; and biasing means coupled to said input to said AC impedance buffer for negatively biasing said bipolar transistor.

17. An electronic test probe as in claim 16 wherein each said at least one bipolar transistor is configured as an emitter follower, the base of each said at least one bipolar transistor is negatively biased, and the collector of each said at least one bipolar transistor is grounded.

18. An electronic test probe as in claim 17 wherein said biasing means comprises an op amp.

* * * * *